United States Patent
Song (10) Patent No.: US 8,499,175 B2
(45) Date of Patent: Jul. 30, 2013

(54) SEMICONDUCTOR DEVICE AND METHOD FOR OPERATING THE SAME

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 312 days.

(21) Appl. No.: 12/964,096

(22) Filed: Dec. 9, 2010

(65) Prior Publication Data
US 2012/0025871 A1  Feb. 2, 2012

(30) Foreign Application Priority Data
Jul. 30, 2010  (KR) ........................ 10-2010-0074105

(51) Int. Cl.
*G06F 1/00* (2006.01)
*G06F 1/26* (2006.01)
*G06F 12/00* (2006.01)
*G11C 5/14* (2006.01)

(52) U.S. Cl.
USPC ............ 713/300; 713/320; 365/227; 711/105

(58) Field of Classification Search
USPC .................... 713/300, 320; 365/227; 711/105
See application file for complete search history.

(56) References Cited

U.S. PATENT DOCUMENTS

| | | | | |
|---|---|---|---|---|
| 6,058,063 | A  * | 5/2000 | Jang ........................ | 365/189.05 |
| 7,889,570 | B2 * | 2/2011 | Lee et al. ................. | 365/189.05 |
| 8,005,995 | B2 * | 8/2011 | Ito et al. ........................... | 710/5 |
| 2006/0285425 | A1 * | 12/2006 | Lee .............................. | 365/233 |

FOREIGN PATENT DOCUMENTS

KR  100784907  12/2007

OTHER PUBLICATIONS

Notice of Preliminary Rejection issued from Korean Intellectual Property Office on Sep. 30, 2011.

* cited by examiner

*Primary Examiner* — Stefan Stoynov
(74) *Attorney, Agent, or Firm* — IP & T Group LLP (57) ABSTRACT

A semiconductor device includes a first buffer element configured to buffer a first mode signal inputted from the outside of the semiconductor device, and a second buffer element configured to buffer a second mode signal inputted from the outside by being enabled in response to an output signal of the first buffer element.

31 Claims, 6 Drawing Sheets

SEMICONDUCTOR DEVICE AND METHOD FOR OPERATING THE SAME

CROSS-REFERENCE TO RELATED APPLICATIONS

The present application claims priority of Korean Patent Application No. 10-2010-0074105, filed on Jul. 30, 2010, which is incorporated herein by reference in its entirety.

BACKGROUND OF THE INVENTION

Exemplary embodiments of the present invention relate to a semiconductor design technology, and more particularly, to a semiconductor device capable of employing a max power down mode.

Generally, semiconductor devices, e.g., Double Data Rate Synchronous Dynamic Random Access Memory (DDR SDRAM), include a mode register set inside. The semiconductor devices perform diverse operations based on the value set in the mode register set. The value of the mode register set is set to a desired value in response to a signal inputted through a plurality of address pins. Here, the operation of setting a value in the mode register set may be defined by external command signals.

The external command signals include a chip selection signal, a row address strobe signal, a column address strobe signal, and a write enable signal. A semiconductor device performs not only the setting operation of the mode register set but also a read operation, a write operation, and a precharge operation based on a combination of the external command signals.

Meanwhile, semiconductor devices are being developed toward low-power operation according to the market demands. In an effort to achieve the low-power operation, semiconductor devices are supported in a max power down mode. Max power down mode is an operation mode for minimizing power consumption and it may be defined in specifications for the semiconductor device.

Figure 1:
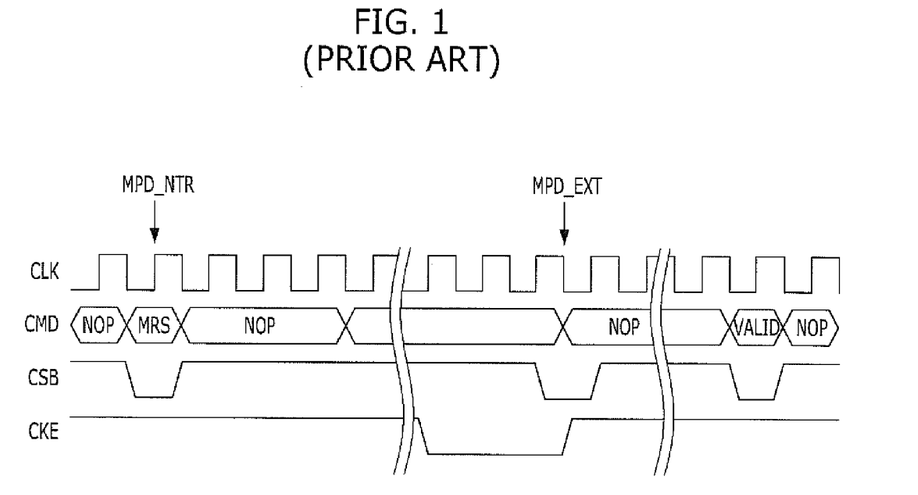
FIG. 1 is a timing diagram illustrating a conventional operation in a max power down mode.

FIG. 1 is a timing diagram illustrating a conventional operation in a max power down mode. Herein, 'NOP' denotes that external command signals CMD and a chip selection signal CSB have values which are not relevant to the operation of a semiconductor device. 'MRS' denotes that the external command signals CMD and the chip selection signal CSB have values for setting the mode register set. 'VALID' denotes that the external command signals CMD and the chip selection signal CSB have values corresponding to a certain operation of a semiconductor device other than the setting operation. Here, the external command signals CMD may be the row address strobe signal, the column address strobe signal, and the write enable signal except the chip selection signal CSB.

Hereafter, an operation of entering the max power down mode and an operation of exiting the max power down mode are described with reference to FIG. 1.

First, during the setting operation of the mode register set defined in response to the external command signals CMD and the chip selection signal CSB, when the mode register set is set to indicate a max power down mode in response to an external address signal, the semiconductor device enters the max power down mode MPD_NTR.

In other words, when the chip selection signal CSB is enabled to a logic low level, the mode register set performs the setting operation based on the external command signals CMD. At the setting operation, the mode register set may be set to indicate the max power down mode in response to the external address signal.

Here, the mode register set outputs a control signal corresponding to the operation of entering the max power down mode, and a buffer unit which receives the external command signals CMD and the external address signal is disabled in response to the control signal. Therefore, the semiconductor device does not perform a buffering operation according to the external command signals CMD and the external address signal and reduces power consumption.

Meanwhile, the semiconductor device uses the chip selection signal CSB and a clock enable signal CKE to exit the max power down mode. In other words, when the chip selection signal CSB is enabled to a logic low level and the clock enable signal CKE transitions from a logic low level to a logic high level, the semiconductor device exits the max power down mode MPD_EXT.

To be specific, the semiconductor device sets the mode register set to have a value corresponding to the max power down mode in response to the external command signals CMD, the chip selection signal CSB, and the external address signal, and performs an operation of entering the max power down mode based on a control signal generated from the set mode register set. Subsequently, in response to the chip selection signal CSB and the clock enable signal CKE, the semiconductor device performs an operation of exiting the max power down mode.

Therefore, the semiconductor device is to keep a buffer element for the chip selection signal CSB and the clock enable signal CKE in the enabled state in order to exit the max power down mode. In addition, the semiconductor device receives a reset signal for controlling a reset operation of a circuit such as the mode register set, and a buffer element which receives the reset signal is to be kept in the enabled state even during the max power down mode.

After all, when the conventional semiconductor device enters the max power down mode, the buffer element for receiving the chip selection signal CSB, the clock enable signal CKE, and the reset signal are to be kept in the enabled state all the time. Therefore, the semiconductor device consumes power for at least three buffer elements although it enters the max power down mode.

SUMMARY OF THE INVENTION

An exemplary embodiment of the present invention is directed to a semiconductor device capable of exiting a max power down mode with a minimum number of buffer elements after entering the max power down mode, and a method for operating the semiconductor device. The semiconductor device may reduce power consumption by controlling the enablement of the buffer element in the max power down mode.

In accordance with an exemplary embodiment of the present invention, a semiconductor device includes: a first buffer element configured to buffer a first mode signal inputted from the outside of the semiconductor device; and a second buffer element configured to buffer a second mode signal inputted from the outside by being enabled in response to an output signal of the first buffer element.

In accordance with another exemplary embodiment of the present invention, a semiconductor device includes: a first normal buffer element and a second normal buffer element configured to buffer a first mode signal and a second mode signal inputted from the outside of the semiconductor device, respectively; a control signal generation unit configured to generate a control signal enabled in response to an output signal of the first normal buffer element; and a mode buffer unit configured to buffer the second mode signal by being enabled in response to the control signal.

In accordance with still another exemplary embodiment of the present invention, a method for operating a semiconductor device includes: disabling buffer elements except a first buffer element at a max power down mode entering operation; detecting information on a max power down mode exit operation in response to a first mode signal inputted through the first buffer element; enabling a second buffer element receiving a second mode signal in response to the detected information; and performing the max power down mode exit operation in response to the first mode signal and the second mode signal.

The semiconductor device according to an exemplary embodiment of the present invention can perform a max power down mode exit operation based on a first mode signal for performing the max power down mode exit operation and a second mode signal inputted into a buffer element, which is enabled in response to the first mode signal. In other words, the semiconductor device can perform the max power down mode exit operation even though only a buffer element for receiving the first mode signal is enabled. Therefore, the semiconductor device according to the exemplary embodiment of the present invention may consume power for one buffer element except the buffer element for receiving a reset signal after performing an operation of entering the max power down mode.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
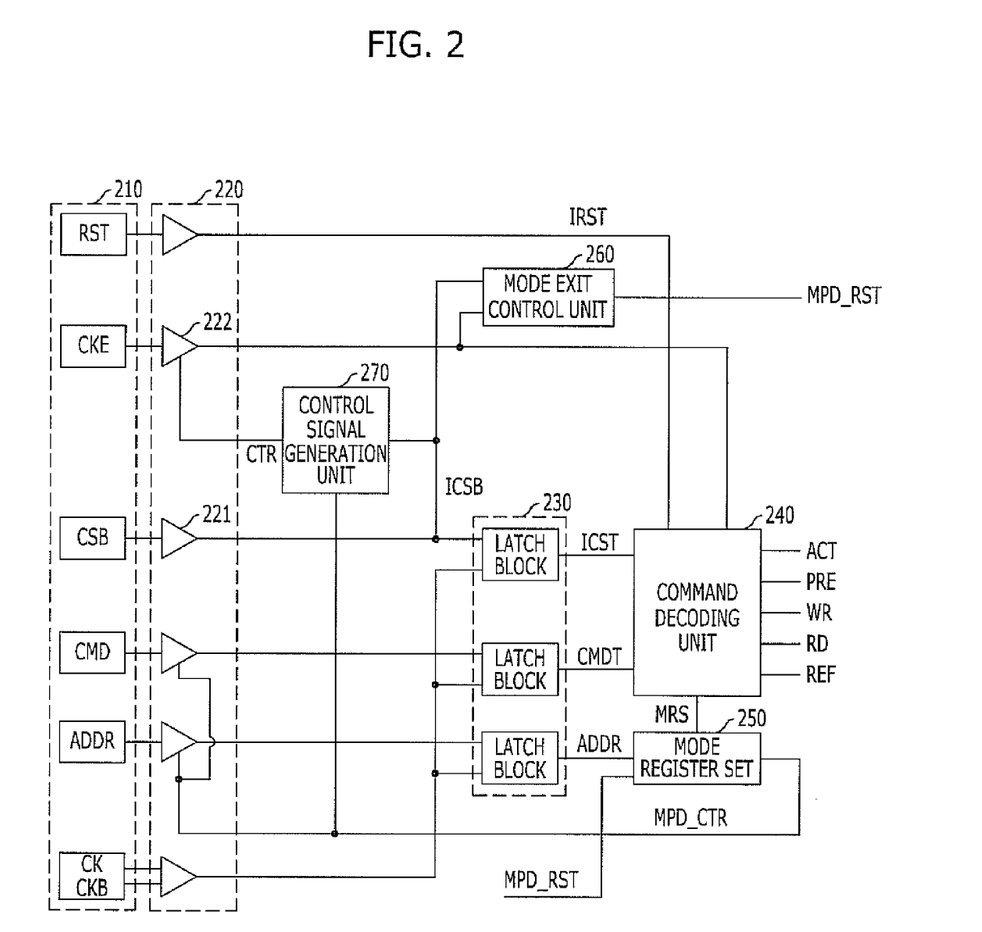
FIG. 2 is a block diagram illustrating the structure of a portion of a semiconductor device in accordance with a first embodiment of the present invention.

FIG. 2 is a block diagram illustrating the structure of a portion of a semiconductor device in accordance with a first embodiment of the present invention.

Referring to FIG. 2, the semiconductor device includes a pad unit 210, a buffering unit 220, a latch unit 230, a command decoding unit 240, a mode register set 250, a mode exit control unit 260 and a control signal generation unit 270.

The pad unit 210 has a plurality of pads and receives a reset signal RST, a clock enable signal CKE, a chip selection signal CSB, external command signals CMD, an external address signal ADDR, a clock signal CK, and a inverted clock signal CKB through the plurality of pads.

The buffer unit 220 has a plurality of buffer elements and buffers the reset signal RST, the clock enable signal CKE, the chip selection signal CSB, the external command signals CMD, the external address signal ADDR, the clock signal CK, and the inverted clock signal CKB outputted from pad unit 210.

Herein, the external command signals CMD include a low address strobe signal, a column address strobe signal, and a write enable signal.

The latch unit 230 having a plurality of latch blocks receives buffered signals corresponding to the chip selection signal CSB, the external command signals CMD, the external address signal ADDR, the clock signal CK and the inverted clock signal CKB from the buffer unit 220.

The latch unit 230 latches the buffered signals corresponding to the chip selection signal CSB, the external command signals CMD, and the external address signal ADDR in response to the clock signal CK and the inverted clock signal CKB.

The command decoding unit 240 decodes the output signals ICST and ICMDT outputted from the latch blocks of the latch unit 230 to generate an active control signal ACT, a pre-charge control signal PRE, a write control signal WT, a read control signal RD, a refresh control signal REF, and a mode register control signal MRS.

The mode register set 250 stores an output signal IADDR corresponding to the external address signal ADDR among the output signals of the plurality of the latch blocks of the latch unit 230 in response to the mode register control signal MRS.

The mode register set 250 outputs diverse control signals according to the stored value. If the mode register set 250 stores a value corresponding to an operation of entering a max power down mode, which is simply referred to as a max power down mode entering operation, it enables a max power down mode control signal MPD_CTR.

The enabled max power down mode control signal MPD_CTR disables a buffer element corresponding to the external command signals CMD and the external address signal ADDR. Through the operation, the semiconductor device does not receive the external command signals CMD and the external address signal ADDR after it performs the max power down mode entering operation. Thus, power consumption may be reduced.

Meanwhile, the max power down mode control signal MPD_CTR which is enabled at the max power down mode entering operation is disabled in response to a max power down mode reset signal MPD_RST when the semiconductor device performs an operation of exiting the max power down mode, which is simply referred to as a max power down mode exit operation.

The mode exit control unit 260 generates the max power down mode reset signal MPD_RST in response to output signals corresponding to the clock enable signal CKE and the chip selection signal CSB among the output signals of the plurality of buffer elements of the buffer unit 220. In short, the max power down mode exit operation is controlled based on the max power down mode reset signal MPD_RST.

The control signal generation unit 270 generates a control signal CTR for controlling an operation of enabling a second buffer element 222 in response to an internal chip selection signal ICSB generated by buffering the chip selection signal CSB.

In other words, the second buffer element 222 for buffering the clock enable signal CKE according to the first embodiment of the present invention may be enabled or disabled in response to the chip selection signal CSB during the max power down mode entering operation.

Figure 3:
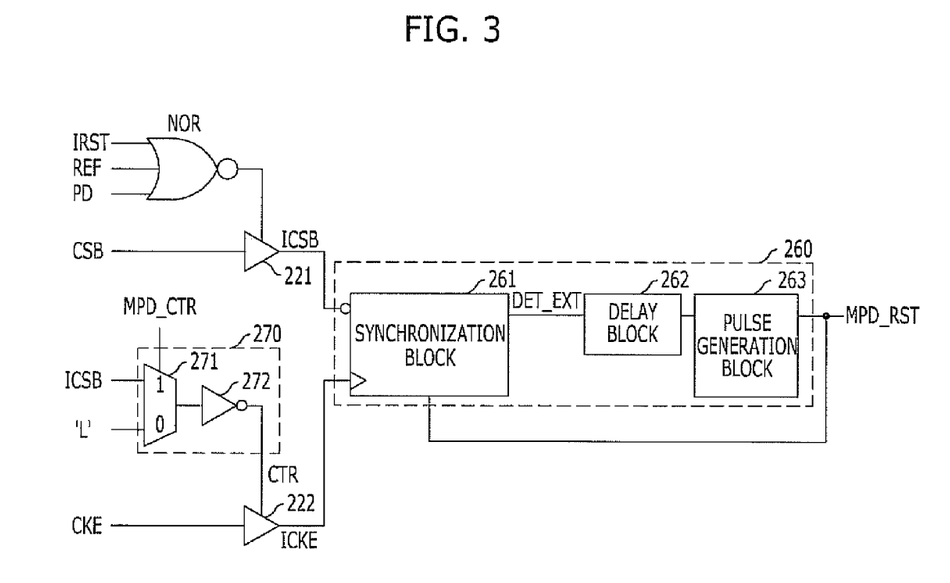
FIG. 3 illustrates a detailed configuration of a first buffer element, a second buffer element, a mode exit control unit 260, and a control signal generation unit 270 shown in FIG. 2.

FIG. 3 illustrates a detailed configuration of a first buffer element, the second buffer element, the mode exit control unit, and the control signal generation unit shown in FIG. 2.

Referring to FIG. 3, the first buffer element 221 generates the internal chip selection signal CSB by buffering the chip selection signal CSB. Here, the enabling and disabling operations of the first buffer element 221 may be controlled in response to an internal reset signal IRST, the refresh control signal REF, and a power down mode control signal PD.

To this end, the first buffer element 221 is designed to be controlled by an output signal of a NOR gate which receives the internal reset signal IRST, the refresh control signal REF, and the power down mode control signal PD.

The second buffer element 222 generates an internal clock enable signal ICKE by buffering the clock enable signal CKE. Here, the enabling and disabling operations of the second buffer element 222 may be controlled in response to the control signal CTR generated in the control signal generation unit 270.

Since the control signal generation unit 270 controls the enabling operation of the second buffer element 222 as described above, the control signal generation unit 270 includes a multiplexing block 271 and an output block 272.

Herein, the multiplexing block 271 outputs the internal chip selection signal ICSB or outputs an output signal of a predetermined logic level which is a logic low (L) level in response to the max power down mode control signal MPD_CTR. Here, the logic level value of the output signal of the logic low (L) level may be changed depending on a circuit design.

Since the exemplary embodiment illustrates a case where the second buffer element 222 is enabled in response to a logic high level, a signal of a logic low level is inputted to the multiplexing block 271.

Subsequently, the output block 272 inverts the output signal of the multiplexing block 271 and outputs the control signal CTR. In other words, the control signal CTR outputted from the output block 272 may be a signal of a logic high level which is obtained by inverting the logic low signal or a signal obtained by inverting the internal chip selection signal ICSB in response to the max power down mode control signal MPD_CTR.

To be specific, the control signal CTR is a logic high signal while the semiconductor device operates in a normal mode, and when the semiconductor device performs the max power down mode entering operation, the control signal CTR becomes a signal obtained by inverting the internal chip selection signal ICSB.

Meanwhile, the mode exit control unit 260 generates the max power down mode reset signal MPD_RST in response to the internal chip selection signal ICSB and the internal clock enable signal ICKE outputted from the first buffer element 221 and the second buffer element 222. The mode exit control unit 260 includes a synchronization block 261, a delay block 262, and a pulse generation block 263.

The synchronization block 261 generates a mode exit signal DET_EXT by synchronizing the internal chip selection signal ICSB with the internal clock enable signal ICKE. The delay block 262 delays the mode exit signal DET_EXT by a predetermined time and outputs a delayed mode exit signal.

The pulse generation block 263 receives an output signal of the delay block 262, and generates the max power down mode reset signal MPD_RST by controlling the pulse width of the received output signal.

Figure 4:
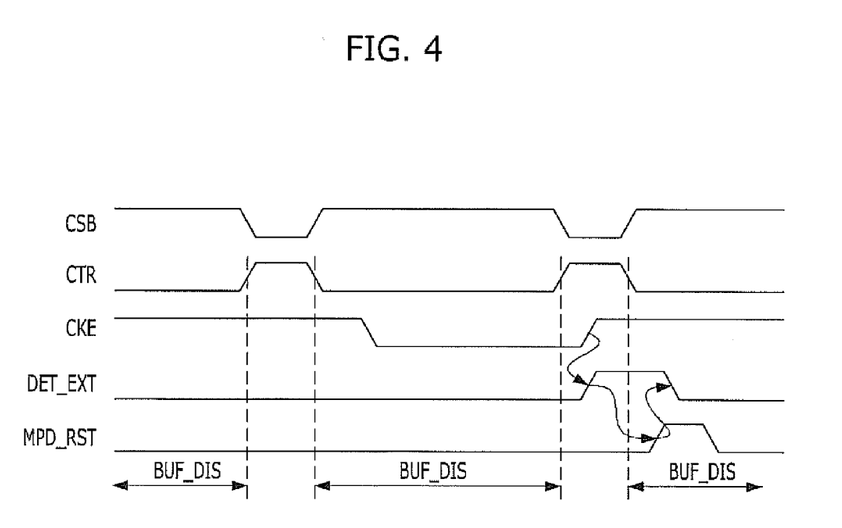
FIG. 4 is a timing diagram illustrating an operation timing of a circuit of FIG. 3.

FIG. 4 is a timing diagram illustrating an operation timing of a circuit of FIG. 3. For the sake of convenience in description, the operation timing of the circuit after the semiconductor device performs the max power down mode entering operation is described.

Referring to FIGS. 2 to 4, the chip selection signal CSB inputted from the outside is a pulse signal of a logic low level, and the internal chip selection signal ICSB outputted from the first buffer element 221 is the same as the chip selection signal CSB.

The multiplexing block 271 of the control signal generation unit 270 outputs the internal chip selection signal ICSB after the max power down mode entering operation, and the output block 272 outputs the control signal CTR obtained by inverting the output signal of the multiplexing block 271.

The second buffer element 222 may be enabled or disabled in response to the control signal CTR. Here, the second buffer element 222 is enabled in a duration where the control signal CTR is a logic high level, and the second buffer element 222 is disabled in a duration BUF_DIS where the control signal CTR is a logic low level.

In short, the second buffer element 222 according to the first embodiment of the present invention is disabled in the duration BUF_DIS where the control signal CTR is a logic low level. Accordingly, the second buffer element 222 may eliminate power consumption in the duration BUF_DIS.

Meanwhile, when the clock enable signal CKE transitions from a logic low level to a logic high level in the duration where the control signal CTR is a logic high level, the synchronization block 261 of the mode exit control unit 260 outputs the internal chip selection signal ICSB as the mode exit signal DET_EXT in response to the internal clock enable signal ICKE, which is an output signal of the second buffer element 222.

Subsequently, the mode exit signal DET_EXT becomes the max power down mode reset signal MPD_RST as it goes through the delay block 262 and the pulse generation block 263. The semiconductor device controls the max power down mode exit operation in response to the max power down mode reset signal MPD_RST.

The max power down mode reset signal MPD_RST is inputted to the mode register set 250 to disable the max power down mode control signal MPD_CTR outputted from the mode register set 250.

Therefore, among the plurality of buffer elements of the buffer unit 220, a buffer element corresponding to the external command signals CMD and the external address signal ADDR is enabled in response to the disabled max power down mode control signal MPD_CTR, and this signifies that the max power down mode exit operation of the semiconductor device is performed.

Here, the max power down mode control signal MPD_CTR, as described in the above, is enabled at the max power down mode entering operation to disable a buffer element corresponding to the external command signals CMD and the external address signal ADDR.

After all, the semiconductor device according to the first embodiment of the present invention may perform the max power down mode exit operation even with a buffer element except the buffer element corresponding to the reset signal RST, i.e., a buffer element corresponding to the chip selection signal CSB, after the semiconductor device performs the max power down mode entering operation. The amount of power consumed in the max power down mode may be minimized.

Meanwhile, the buffer unit 220 including the plurality of the buffer elements is designed as a circuit having a high driving force in order to perform an operation rapidly during a normal operation. In a second embodiment of the present invention, which is described hereafter, power consumption may be reduced at the max power down mode exit operation by using a buffer unit formed as a circuit having a relatively small driving force.

Figure 5:
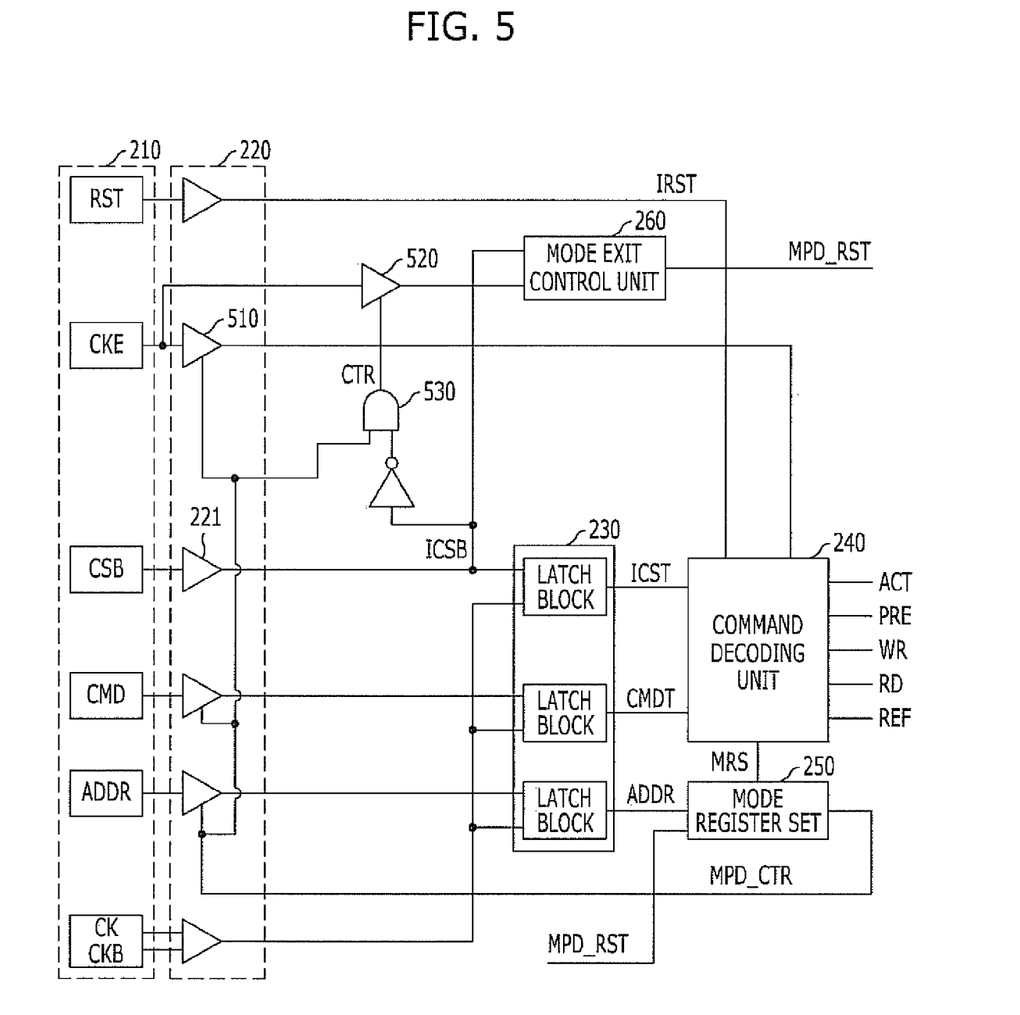
FIG. 5 is a block diagram describing the structure of a portion of a semiconductor device in accordance with a second embodiment of the present invention.

FIG. 5 is a block diagram describing the structure of a portion of a semiconductor device in accordance with a second embodiment of the present invention. For the sake of convenience in description, the same reference numerals of FIG. 2 are given to the same constituent elements. Hereafter, the second embodiment of the present invention is described focusing on the difference from the embodiment of FIG. 2.

Referring to FIG. 5, the semiconductor device includes a normal buffer unit 510, a mode buffer unit 520, a control signal generation unit 530, a latch unit 230, a command decoding unit 240, a mode register set 250 and a mode exit control unit 260.

The description of the latch unit 230, the command decoding unit 240, the mode register set 250 and the mode exit control unit 260 shown in FIG. 5 is omitted because they are identical to the latch unit 230, the command decoding unit 240, the mode register set 250 and the mode exit control unit 260 shown in FIG. 2.

The normal buffer unit receives a clock enable signal CKE. The enabling and disabling operations of the normal buffer unit 510 are controlled based on the max power down mode control signal MPD_CTR.

In other words, the normal buffer unit 510 is disabled in response to the max power down mode control signal MPD_CTR at the max power down mode entering operation, and the normal buffer unit 510 is enabled in response to the max power down mode control signal MPD_CTR at the max power down mode exit operation.

The mode buffer unit 520 is a circuit having a smaller driving force than the normal buffer unit 510. The mode buffer unit 520 buffers and outputs the clock enable signal CKE. The mode buffer unit 520 is controlled based on a control signal CTR generated in a control signal generation unit 530.

The control signal generation unit 530 may be designed as an AND gate which receives the max power down mode control signal MPD_CTR and an internal chip selection signal ICSB.

Therefore, while the max power down mode control signal MPD_CTR is enabled to a logic high level during the max power down mode, the mode buffer unit 520 is enabled in response to the internal chip selection signal ICSB inputted as a pulse signal of a logic high level.

At this time, if the clock enable signal CKE transitions to a logic high level, the mode exit control unit 260 synchronizes the internal chip selection signal ICSB with an internal clock enable signal ICKE and enables a max power down mode reset signal MPD_RST.

The mode register set 250 disables the max power down mode control signal MPD_CTR in response to the max power down mode reset signal MPD_RST, and the normal buffer unit 510 receiving the clock enable signal CKE, the buffer element receiving external command signals CMD, and the buffer element receiving an external address signal ADDR are enabled. This signifies that the semiconductor device performs the max power down mode exit operation.

As described above, in the semiconductor device according to the second embodiment of the present invention, the mode buffer unit 520 having a small driving force is enabled in response to the chip selection signal CSB after the max power down mode entering operation.

After all, the semiconductor device according to the second embodiment of the present invention may perform the max power down mode exit operation even with a buffer element except a buffer element corresponding to the reset signal RST, i.e., a buffer element corresponding to the chip selection signal CSB, after the max power down mode entering operation.

The amount of power consumed in the max power down mode may be minimized. Also, the mode buffer unit 520 which is enabled at the max power down mode exit operation is a circuit having a relatively small driving force, and the amount of power consumed at the max power down mode exit operation may be minimized as well.

Meanwhile, the exemplary embodiment illustrates a case where the chip selection signal CSB has a predetermined pulse width of a logic low level. However, in the third embodiment which is described hereafter is described a case where the pulse width of the chip selection signal CSB is changed during the max power down mode exit operation. The chip selection signal CSB inputted to the semiconductor device may be inputted with a relatively long pulse width during the max power down mode exit operation.

Therefore, in the third embodiment of the present invention, a pulse detector for detecting the long pulse width of the chip selection signal CSB at the max power down mode exit operation is further provided.

Figure 6:
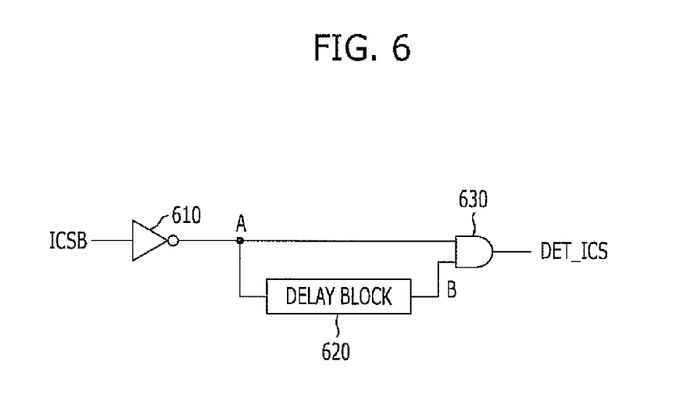
FIG. 6 illustrates a pulse detector in accordance with a third embodiment of the present invention.

FIG. 6 illustrates a pulse detector in accordance with the third embodiment of the present invention. The pulse detector receives the internal chip selection signal ICSB shown in the embodiment of FIG. 5 and generates a mode detection signal DET_ICS.

The mode detection signal DET_ICS is inputted to the control signal generation unit 530 or 270. Here, in the embodiment of FIG. 5, the pulse detector may replace an inverter for inverting the internal chip selection signal ICSB and inputting the inverted internal chip selection signal to the control signal generation unit 530 in order to meet the logic level of a signal.

Referring to FIG. 6, the pulse detector detects the chip selection signal CSB having a long pulse width inputted during the max power down mode exit operation.

The pulse detector includes an input unit 610, a delay block 620 and an output block 630. The input unit 610 receives the internal chip selection signal ICSB and inverts the internal chip selection signal ICSB. The input unit 610 may be formed of an inverter.

The delay block 620 delays a signal A outputted from the input unit 610 by a predetermined time and outputs a delayed signal. The output block 630 generates the mode detection signal DET_ICS in response to the output signal A of the input unit 610 and an output signal B of the delay block 620.

The output block 630 may be formed of an AND gate. Here, the delay time of the delay block 620 may be determined to be longer than a time corresponding to the pulse width of the chip selection signal CSB inputted while the semiconductor device does not perform the max power down mode exit operation and shorter than a time corresponding to the pulse width of the chip selection signal CSB inputted while the semiconductor device performs the max power down mode exit operation.

Figure 7:
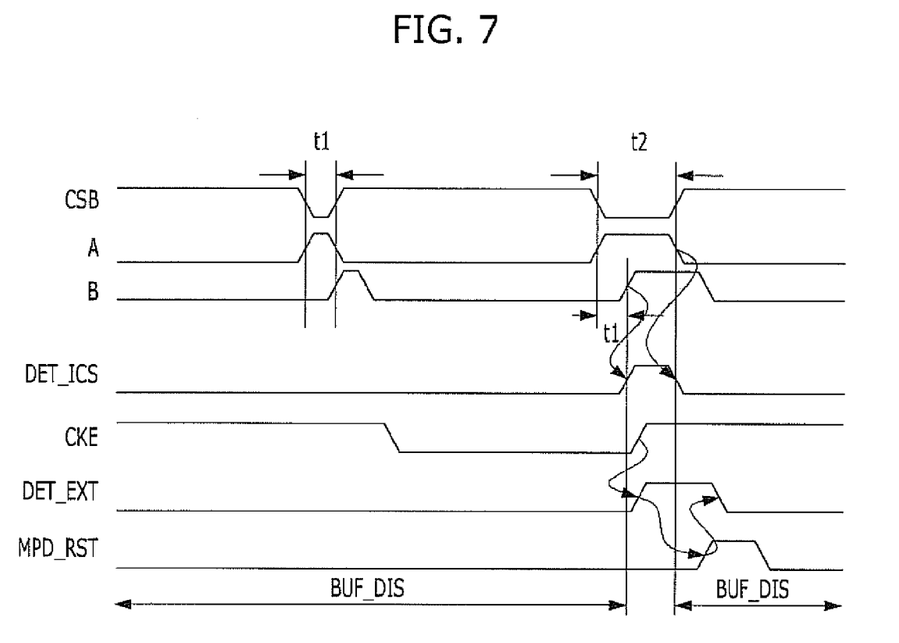
FIG. 7 is a timing diagram illustrating an operation timing of a pulse detector of FIG. 6.

FIG. 7 is a timing diagram illustrating an operation timing of the pulse detector of FIG. 6. For the sake of convenience in description, it, is assumed that the pulse width of the chip selection signal CSB inputted while the semiconductor device does not perform the max power down mode exit operation corresponds to 't1,' and the pulse width of the chip selection signal CSB inputted while the semiconductor device performs the max power down mode exit operation corresponds to 't2.'

In other words, the delay time of the delay block 620 may range from 't1' to 't2,' and a clock enable signal CKE transitions within the enabling duration of the generated mode detection signal DET_ICS.

Referring to FIGS. 6 and 7, the chip selection signal CSB inputted from the outside is a pulse signal of a logic low level, and the output signal A of the input unit 610 is an inversion signal thereof. The output signal B of the delay block 620 is a signal obtained by delaying the output signal A of the input unit 610 by a predetermined time.

As illustrated in the drawing, the chip selection signal CSB has a pulse width of t2 which is longer than the pulse width of t1 during the max power down mode exit operation. Therefore, the mode detection signal DET_ICS outputted from the output block 630 becomes a pulse signal enabled in response to the chip selection signal CSB corresponding to t2, but with controlled pulse width.

Subsequently, the mode detection signal DET_ICS is inputted to the control signal generation unit 270 and 530 of the first and second embodiments, and used as a control signal CTR for controlling the buffer element that receives the clock enable signal CKE.

After all, the semiconductor device according to the third embodiment of the present invention may disable a buffer element which receives the clock enable signal CKE in a duration BUF_DIS where the mode detection signal DET_ICS is in a logic low level, and enable the buffer element in a duration where the mode detection signal DET_ICS is in a logic high level. The amount of power consumed in the max power down mode may be minimized/reduced.

The semiconductor device according to the first to third embodiments of the present invention performs the max power down mode exit operation even with a buffer element except a buffer element corresponding to the reset signal RST, i.e., a buffer element corresponding to the chip selection signal CSB, after the max power down mode entering operation.

In particular, in case of the second embodiment, since the buffer element having a small driving force is used to receive the clock enable signal CKE for the max power down mode exit operation, the amount of power consumed at the max power down mode exit operation may be reduced as well.

In case of the third embodiment, since the max power down mode exit operation is detected and a buffer element which receives the clock enable signal CKE is enabled only in a desirable duration based on the detection result, the amount of power consumed in the max power down mode may be further minimized.

The semiconductor device according to exemplary embodiments of the present invention can achieve a low-power operation by consuming power for a minimum number of buffer elements in the max power down mode.

While the present invention has been described with respect to the specific embodiments, it will be apparent to those skilled in the art that various changes and modifications may be made without departing from the spirit and scope of the invention as defined in the following claims.

Also, although the embodiments of the present invention described above illustrate a case where the semiconductor device operates upon receipt of the chip selection signal CSB and the clock enable signal CKE corresponding to the max power down mode exit operation, the concept of the present invention may be applied to a case where a semiconductor device operates upon receipt of a signal corresponding to a certain operation mode, too.

The logic gates and transistors illustrated in the above embodiments of the present invention may be realized in different positions and kinds according to the polarity of an input signal.

What is claimed is:

1. A semiconductor device, comprising:
   a first buffer element configured to buffer a first mode signal inputted from the outside of the semiconductor device; and
   a second buffer element configured to buffer a second mode signal inputted from the outside by being enabled in response to an output signal of the first buffer element,
   wherein the first mode signal is a signal having a predetermined pulse width, and the second mode signal is a signal transitioning at a predetermined moment.

2. The semiconductor device of claim 1, further comprising:
   a mode exit control unit configured to control a max power down mode exit operation in response to the output signal of the first buffer element and an output signal of the second buffer element.

3. The semiconductor device of claim 2, further comprising:
   a mode register set configured to enable a mode control signal for a max power down mode entering operation in response to an external command signal, and disable the mode control signal for the max power down mode exit operation in response to an output signal of the mode exit control unit.

4. The semiconductor device of claim 3, wherein the second buffer element is disabled in response to the mode control signal during the max power down mode entering operation.

5. The semiconductor device of claim 2, wherein the first mode signal and the second mode signal correspond to the max power down mode exit operation.

6. The semiconductor device of claim 2, wherein the first mode signal has a different pulse width in a normal operation and in the max power down mode exit operation individually.

7. The semiconductor device of claim 6, further comprising:
   a pulse detector configured to detect a pulse width of the first mode signal inputted at the max power down mode exit operation.

8. The semiconductor device of claim 7, wherein the pulse detector generates a mode detection signal for controlling the second buffer element when the detected pulse width of the first mode signal is different from a pulse width of a signal inputted in the normal operation.

9. The semiconductor device of claim 1, wherein the first mode signal is an external command signal, and the second mode signal is a clock enable signal.

10. The semiconductor device of claim 1, further comprising a control signal generation unit configured to generate a control signal in response to the output signal of the first buffer element, wherein the second buffer element is enabled in response to the control signal.

11. The semiconductor device of claim 10, wherein the control signal generation unit enables the second buffer element in a normal mode, and enables the second buffer element in response to the output signal of the first buffer element in a max power down mode.

12. The semiconductor device of claim 10, further comprising:
a mode exit control unit configured to control an exit operation from a max power down mode in response to the output signal of the first buffer element and an output signal of the second buffer element.

13. The semiconductor device of claim 12, wherein the mode exit control unit synchronizes the output signal of the first buffer element with the output signal of the second buffer element.

14. The semiconductor device of claim 12, further comprising:
a mode register set configured to enable a mode control signal for an entering operation to the max power down mode in response to an external command signal, and disable the mode control signal for the exit operation from the max power down mode in response to an output signal of the mode exit control unit.

15. The semiconductor device of claim 14, wherein the control signal generation unit enables the second buffer element in response to the mode control signal and the output signal of the first buffer element.

16. The semiconductor device of claim 1, wherein the second buffer element is enabled in a first mode and enabled in a period of an enablement of the first mode signal in a second mode.

17. A semiconductor device, comprising:
a first normal buffer element and a second normal buffer element configured to buffer a first mode signal and a second mode signal inputted from the outside of the semiconductor device, respectively;
a control signal generation unit configured to generate a control signal enabled in response to an output signal of the first normal buffer element; and
a mode buffer unit configured to buffer the second mode signal by being enabled in response to the control signal, wherein the first mode signal is a signal having a predetermined pulse width, and the second mode signal is a signal transitioning at a predetermined moment.

18. The semiconductor device of claim 17, wherein a driving force of the mode buffer unit is smaller than a driving force of the second normal buffer element.

19. The semiconductor device of claim 17, wherein the control signal generation unit enables the mode buffer unit in response to the output signal of the first normal buffer element in a max power down mode.

20. The semiconductor device of claim 17, wherein the second normal buffer element is disabled in a max power down mode, and the second normal buffer element is enabled in a normal mode.

21. The semiconductor device of claim 17, further comprising:
a mode exit control unit configured to control an exit operation from a max power down mode in response to the output signal of the first normal buffer element and an output signal of the mode buffer unit.

22. The semiconductor device of claim 21, wherein the mode exit control unit synchronizes the output signal of the first buffer element with the output signal of the mode buffer unit.

23. The semiconductor device of claim 21, further comprising:
a mode register set configured to enable a mode control signal for an entering operation to the max power down mode in response to an external command signal, and disable the mode control signal for the exit operation from the max power down mode in response to an output signal of the mode exit control unit.

24. The semiconductor device of claim 23, wherein an enabling operation of the second normal buffer element is controlled in response to the mode control signal.

25. The semiconductor device of claim 17, wherein the mode buffer unit is disabled in a normal mode and enabled in a period of an enablement of the first mode signal in a max power down mode.

26. A method for operating a semiconductor device, comprising:
disabling buffer elements except a first buffer element at an entering operation to a max power down mode;
detecting information for an exit operation from the max power down mode in response to a first mode signal inputted through the first buffer element;
enabling a second buffer element receiving a second mode signal in response to the detected information; and
performing the exit operation from the max power down mode in response to the first mode signal and the second mode signal.

27. The method of claim 26, further comprising:
enabling the buffer elements by the performing of the exit operation from the max power down mode.

28. The method of claim 26, wherein the entering operation to the max power down mode is defined in response to an external command signal and an external address signal.

29. The method of claim 26, wherein the disabling of the buffer elements include generating a control signal for disabling the second buffer element at the entering operation, and the enabling of the second buffer element includes generating the control signal for enabling the second buffer element at the exit operation.

30. The method of claim 26, wherein the first mode signal has a different pulse width in a normal operation and in the exit operation individually.

31. The method of claim 30, wherein the pulse width of the first mode signal is detected in the detecting of the information on the exit operation from the max power down mode.

* * * * *